[11] 3,629,787

United States Patent

[72] Inventor James Wilson
Fair Haven, N.J.

[21] Appl. No. 47,820
[22] Filed June 19, 1970
[45] Patented Dec. 21, 1971
[73] Assignee Bell Telephone Laboratories, Incorporated
Murray Hill, N.J.

[54] CONNECTOR FOR FLEXIBLE CIRCUITRY
5 Claims, 7 Drawing Figs.

[52] U.S. Cl. 339/17 F, 174/88 R, 317/101 CM, 339/75 MP, 339/176 MF
[51] Int. Cl. H05k 1/04
[50] Field of Search 339/17, 176 MF, 176 MP, 75 MP, 273; 174/88 R, 88 S, 117.1, 1, 117.5; 317/101 CM, 101 CE, 101 DH, 101 F

[56] References Cited

UNITED STATES PATENTS 3,492,538 1/1970 Fergusson 339/176 MF X
3,082,398 3/1963 Valach 339/17 F X
2,952,002 9/1960 Angele et al. 339/75 MP
2,841,773 7/1958 Shumate 174/88 R X
3,221,096 11/1965 Croghan 174/88 R

FOREIGN PATENTS 700,490 12/1953 Great Britain 339/17 F

OTHER REFERENCES

IBM Technical Disclosure Bulletin, Vol. 9, No. 10, Mar. 1967, pg. 1283, " Transmission Line Cable Connector," D. O. Johnson, Jr.

*Primary Examiner*—Marvin A. Champion
*Assistant Examiner*—Terrell P. Lewis
*Attorneys*—R. J. Guenther and Edwin B. Cave

ABSTRACT: This disclosure describes a connector for joining items of flexible circuitry. A chambered clamping bar houses compression elements which force exposed circuit paths of the flexible circuitry against an element to be joined thereto. Fingered springs and spring-loaded rubber pads are two species of the compression element. The bar may be clipped, screwed, or snap mounted to the circuitry to be joined.

INVENTOR
J. WILSON
BY Charles E. Graves
ATTORNEY

CONNECTOR FOR FLEXIBLE CIRCUITRY

FIELD OF THE INVENTION

This invention relates to the connecting of flexible circuitry to printed circuit boards or other flexible circuits.

BACKGROUND OF THE INVENTION

Numerous expedients exist for the connection of elements of flexible circuitry to each other or to printed circuit boards having like spacing between their conductive lands. As herein used, the term flexible circuitry means a circuit consisting of flat, parallel conductors (usually rolled copper) laminated between two layers of plastic insulation. Where low cost, simplicity, and reliability are principal considerations existing connectors do not fully meet the requirements. This is particularly the case with miniature circuitry such as is found in modern telephone station sets.

Accordingly, a principal object of the invention is to simplify the connecting of flexible circuitry.

A further object of the invention is to reduce the number of elements required for a flexible circuitry connector.

A specific object of the invention is to reduce the time required for effecting flexible circuit connections.

A still further object of the invention is to achieve reliable solderless long term compression connections to flexible circuit elements.

A still further object of the invention is to reduce the cost of flexible circuit connectors.

A still further inventive object is to render it unnecessary to significantly prepare the flexible circuit region to be connected.

SUMMARY OF THE INVENTION

Metal-to-metal contact is made between flexible circuit lands and the plated lands of a similar circuit or of a terminal board. The paths are pressed together by a compression element as, for example, a multifingered spring which applies individual force from the insulated side of the flexible circuit. The spring is mounted in a clamping bar that fastens, clips or otherwise holds together the circuit elements being connected.

In one embodiment, the clamping bar is chambered to receive one or several unitary multifingered springs which are held in the chamber by means of a slight interference fit, for example. As in all embodiments, regardless of the clamping bar length or the number of contacts to be affected, a single fastening element suffices to press together the bar and the underlying circuitry to be connected.

In one embodiment, the fastening means is simply a centrally located screw which joins the bar to the underlying terminal board or to a nut fastener.

In a second embodiment substantially the same clamping bar is used with spring-loaded rubber pads in place of the multifingered unitary springs. This embodiment has the advantages of applying contact force evenly along a substantial length of metal path rather than merely at a single point.

The invention, its further objects, features, advantages and embodiments will be readily discerned from a reading of the detailed description to follow.

DETAILED DESCRIPTION OF ILLUSTRATIVE INVENTIVE EMBODIMENTS

Figure 1:
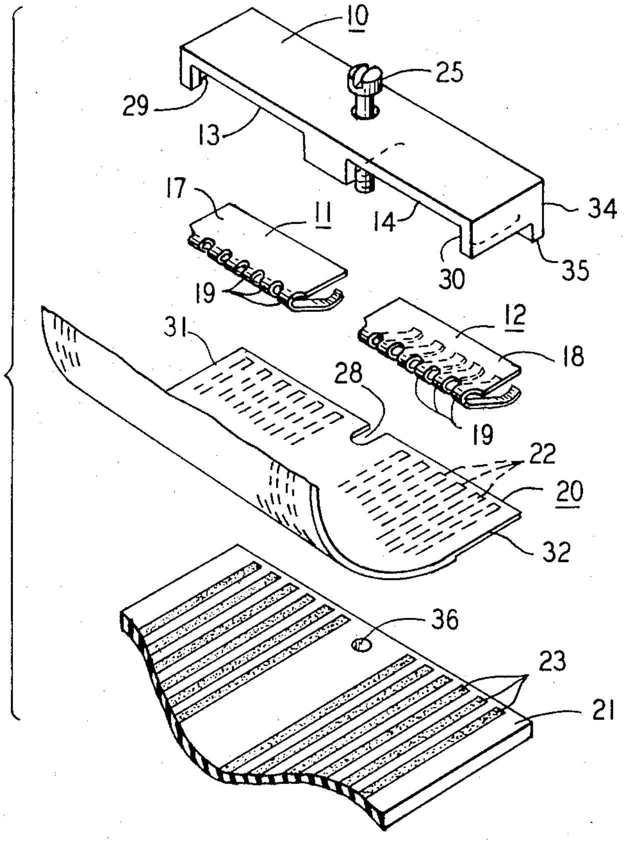
FIG. 1 is an exploded perspective view of a first embodiment of the invention.
Figure 3:
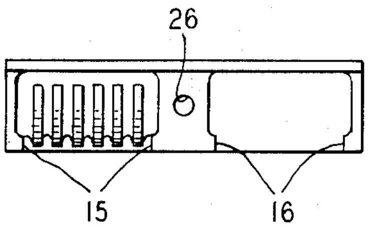
FIG. 3 is a bottom view of a spring-contact module in place in a clamping bar.

FIG. 1 depicts a first embodiment consisting of a clamping bar 10, and a pair of spring contacts 11, 12. Clamping bar 10 includes chambers 13, 14 which are open at the bottom and at least partially open at the front. Rib portions 15, 16 of chambers 13, 14 respectively, shown in FIG. 3, are provided to retain the bases 17, 18 of the spring contacts 11, 12.

Each of the spring contacts 11, 12 include a plurality of contact fingers each designated 19. In each spring contact, the end contact fingers are inset somewhat as shown in FIG. 1 to provide room for the end portions of bases 17 and 18 to engage the ribs 15, 16. The fingers extend down across the open front of bar 10.

Figure 2:
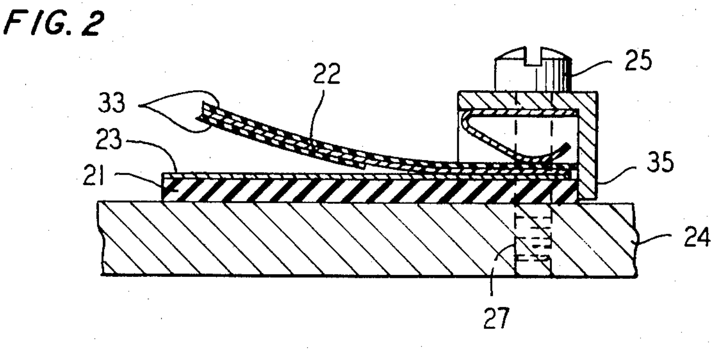
FIG. 2 is a sectional side view of the first inventive embodiment, showing multifingered spring contacts.

FIG. 1 illustrates the case of effecting connection between a flexible circuit 20 and a printed circuit board 21. These two elements have like spacing between conductive lands 22 on the flexible circuit and 23 on the printed circuit board. As seen in FIG. 2, this embodiment calls preferably for mounting of the clamping bar 10 on a relatively rigid substrate 24 since usually circuit boards do not have sufficient rigidity to assure an even contact if only a single fastening is employed. Substrate 24 thus laterally rigidifies the flexible circuit 20 and the printed circuit board 21.

A single fastening as used herein consists, for example, of screw 25 placed through a hole 26 at the center of clamping bar 10 and engaging to the threaded portion 27 of substrate 24. Registration slot 28 is provided in flexible circuit 20, at the central part of its forward end to locate the flexible circuit 20 correctly with respect to the fingers 19 of the spring 11, 12. The flexible circuit 20 typically extends beyond the sides of the clamping bar 10.

As seen in FIG. 2, the completed connection is achieved by stripping off the portion of the underlying insulation 33 of flexible circuit 20 so that its land areas 22 are exposed for direct contact to the land areas 23 of board 21. Advantageously, the back side 34 of clamping bar 10 includes an overhanging edge 35 which, as seen in FIG. 2 provides a locating surface for circuit board 21 and flexible circuit 20. Proper lateral locating of the board 21 is advantageously provided by the central hole 36 through which the screw 25 passes. Full engagement of the screw forces the spring-contact fingers 19 down upon the insulated side of the flexible circuit conductive lands 22, thus forcing the circuit paths of the flexible circuit 20 and of the printed circuit board 21 into contact. It is seen that the contact force is independent of screw torque once clamping bar 10 is seated.

Figure 4:
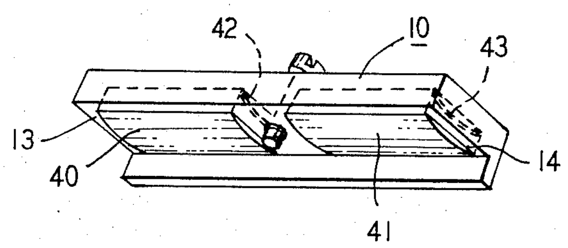
FIG. 4 is a bottom perspective view of a second inventive embodiment using spring-loaded compliant contact pads.
Figure 5:
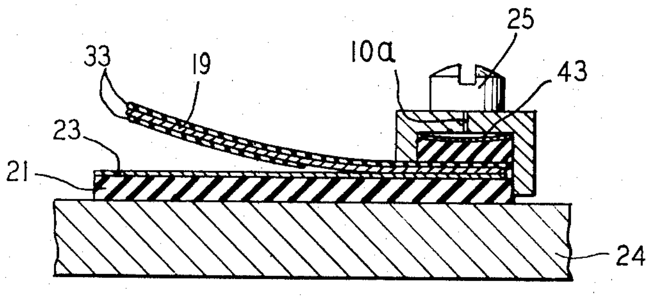
FIG. 5 is a side sectional view of the embodiment of FIG. 4 showing a compliant pad compressing a flexible circuit.

The inventive embodiment depicted in FIGS. 4 and 5 differs from that depicted in FIGS. 1–3 in that in place of the spring contacts 11, 12 there are provided spring-loaded compliant pressure pads 40, 41 in the chambers 13, 14 of the clamping bar 10. The springs 42, 43 are leaf springs which run the entire length of the chamber in which mounted, and as seen in FIG. 5, seat in the chamber with a pronounced outward bow. The pads 40, 41 are of soft rubber or the like. In their uncompressed position, pads 40, 41 extend substantially outwardly of their chambers 13, 14. The pads 40, 41 have relatively flat contact faces, and are held in their chambers by means of a slight interference fit.

FIG. 5 depicts the second inventive embodiment with the loaded pressure pad in place against the insulated side of the flexible circuit member 20. The pressure developed in the pads, by springs 42, 43 acts uniformly over the length of the chambers 13, 14 and thereby imparts an equal contact force to all lands. As in the first inventive embodiment, it is desirable to employ a rigid substrate 24 to assure an even application of contact pressure. A vent **10*a* allows springs 42, 43 and pads 40, 41** to reassume their unloaded configuration when the clamping force is removed.

Figure 6:
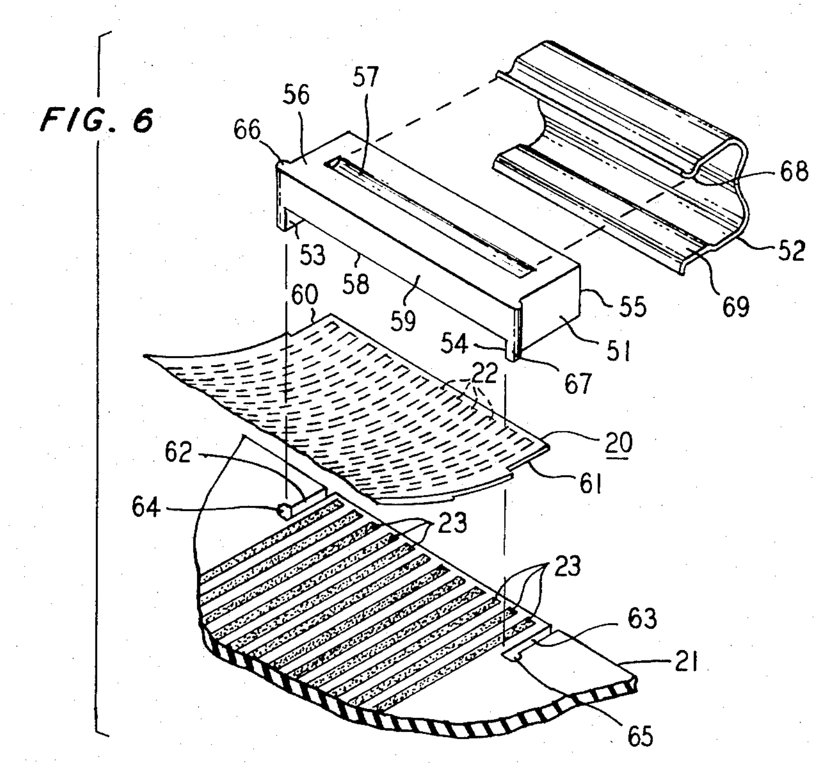
FIG. 6 is a third inventive embodiment in exploded perspective.
Figure 7:
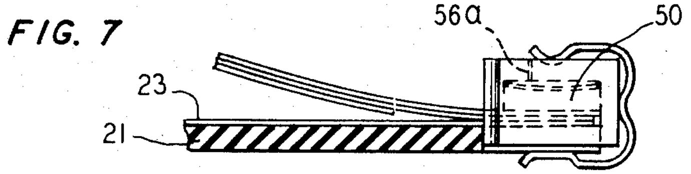
FIG. 7 is a sectional side view of the third inventive embodiment.

In a third inventive embodiment, depicted in FIGS. 6 and 7, a single elongated pressure pad designated 50 is used with a clamping bar 51 and a single U-shaped spring fastener 52. Clamping bar 51 includes a pair of sides 53, 54 a back end 55 and a top surface or roof 56 with a longitudinal groove 57 molded therein. The pad 50 is confined, by a slight interference fit, in the interior chamber defined in bar 41 and in its uncompressed state extends substantially beyond the lip 58 of the front side 59.

FIG. 6 illustrates the case of a connection between a flexible circuit 20 and a printed circuit board 21 of the type shown in FIG. 1. Besides stripping back the insulation from the bottom side thereof, circuit 20 is provided also with a set of end notches 60, 61 which are guided by the surfaces of sides 53, 54 respectively. Also, the ends of notches 60, 61 provide stops which contact the end portions of the front face 59 of bar 51.

Preparation of the printed circuit board 21 includes the cutting of elongated notches 62, 63 outwardly parallel with the land regions 23. The interior ends of notches 62, 63 include outwardly extending well portions 64, 65 which as seen in FIG. 6, are adapted to accommodate the ribs 66, 67 of the bar 51.

Fastener 52 includes an upper bearing surface 68 which fits into the groove 57 of bar 51; and a relatively flattened lower bearing surface 69. As seen in FIG. 7, the assembled connection shows the ribs 66, 67 and the sides 53, 54 of bar 51 engaged into the accommodating slots 62, 63 and wells 64, 65 of the board 21, thus fixing the bar with respect to the board. With the clamp 52 in place, the bearing surface 69 provides a rigid underpinning to assure even contact pressure, supplied by the pad 50. Vent 56*a* serves the same purpose as vent 10*a* in the second embodiment.

This third embodiment shown in FIGS. 6 and 7 thus exhibits the advantage of requiring no rigid underlying substrate such as 24 shown in FIG. 2 and FIG. 5. Furthermore, this embodiment, of the inventive connector more readily lends itself to use for connecting two elements of flexible circuitry. It is seen that the circuit board 21, depicted in FIG. 7 as being connected to the flexible circuit 20 could readily be a second flexible circuit substantially identical to the circuit 20.

Several illustrative embodiments of the basic inventive concept have been described, and the claims to follow are intended to embrace these and all equivalent embodiments.

What is claimed is:

1. Apparatus for connecting an element of flexible circuitry to a circuit medium having like spacing between conductive lands, comprising:
   a unitary clamping bar with plural chambers,
   a spring with plural contact fingers adapted to mount in each said chamber, each said spring finger protruding a predetermined distance beyond the floor of said clamping bar, the flexible circuit insulation being stripped back on one side to expose the lands, said spring fingers contacting said flexible circuit from the insulated side,
   means for affixing said clamping bar to said terminal board, thereby to bias said spring fingers and force together the flexible circuit lands and those on said terminal board, said clamping bar including alignment notches, and said flexible circuit including cutout end portions for engagement with said alignment notches.

2. Apparatus for connecting an element of flexible circuitry to a circuit medium having like spacing between conductive lands, comprising:
   clamping means having one or more chambers each defined by a roof, two side members, a rear and an at least partially open front for receiving said element and said medium edgewise in mating, land-contacting relation,
   compression means mounted in said chamber and extending across said open front and comprising first and second unitary springs each having plural spring contact arms for pressing against the insulated side of respective said lands of said flexible circuit element, each said chamber comprising ribs for locating the respective said springs,
   support means comprising an underlying substrate for laterally rigidifying said flexible circuit element and said medium, and
   a single fastening means for securing said clamping means to said support means comprising a threaded fastener centrally connecting said clamping means to said substrate.

3. Apparatus pursuant to claim 2, wherein said printed circuitry element further comprises a registration slot in its forward end for engaging said fastener.

4. Apparatus for connecting an element of flexible circuitry to a circuit medium having like spacing between conductive lands, comprising:
   clamping means having one or more chambers each defined by a roof including an elongated roof slot, two side members, a rear, and an at least partially open front for receiving said element and said medium edgewise in mating, land-contacting relation,
   compression means mounted in said chamber and extending across said open front for pressing upon the insulated side of said flexible circuitry,
   support means for laterally rigidifying said flexible circuit element and said medium,
   a single fastening means for securing said clamping means to said support means, and
   said support means and said fastening means comprising an elongated U-shaped spring fastener with upper and lower bearing surfaces, said upper surface engaging said roof slot and said lower surface rigidly supporting the underside of said circuit medium.

5. Apparatus for connecting an element of flexible circuitry to a circuit medium having like spacing between conductive lands, comprising:
   clamping means having one or more chambers each defined by a roof, two side members, a rear, and at least partially open front for receiving said element and said medium edgewise in mating, land-contacting relation,
   compression means comprising a rubber pad mounted in, and substantially completely occupying, each said chamber, each said pad backed by an outwardly bowing leaf spring, the contacting face of each said pad being relatively flat for pressing against a substantial lengthwise portion of the insulated side of the respective said lands of said flexible circuit element,
   support means for laterally rigidifying said flexible circuit element and said medium, and
   a single fastening means for securing said clamping means to said support means.

* * * * *